United States Patent
Chay et al.

(10) Patent No.: US 12,119,638 B2
(45) Date of Patent: Oct. 15, 2024

(54) HOT AND HAZARDOUS INDICATOR ON SOLID STATE DRIVES

(71) Applicant: Intel Corporation, Santa Clara, CA (US)

(72) Inventors: Chin Fatt Chay, Sungai Jawi (MY); Andrew Morning-Smith, Vancouver (CA); Boon Seong Khoo, Penang (MY); Timothy Rothman, El Dorado, CA (US); Yi Heng Khor, Bukit Mertajam (MY)

(73) Assignee: Intel Corportation, Santa Clara, CA (US)

( * ) Notice: Subject to any disclaimer, the term of this patent is extended or adjusted under 35 U.S.C. 154(b) by 650 days.

(21) Appl. No.: 17/313,603

(22) Filed: May 6, 2021

(65) Prior Publication Data
US 2021/0257828 A1    Aug. 19, 2021

(51) Int. Cl.
*H02H 5/04* (2006.01)
*G08B 5/38* (2006.01)
*G08B 21/18* (2006.01)
*H02H 1/00* (2006.01)
(Continued)

(52) U.S. Cl.
CPC ............ *H02H 5/04* (2013.01); *G08B 5/38* (2013.01); *G08B 21/182* (2013.01); *H02H 1/0007* (2013.01); *H05B 45/3725* (2020.01); *H05B 45/395* (2020.01)

(58) Field of Classification Search
CPC ..... H02H 5/04–042; H02H 5/044–048; H02H 1/0007; G06F 11/3058; G08B 21/182; G08B 5/38
See application file for complete search history.

(56) References Cited

U.S. PATENT DOCUMENTS

| 2011/0140898 | A1 | 6/2011 | Berke et al. |
| 2013/0120149 | A1 | 5/2013 | Berke et al. |
| 2019/0261538 | A1* | 8/2019 | Alshinnawi ............... G06F 1/20 |

(Continued)

FOREIGN PATENT DOCUMENTS

DE    102008054603 A1    6/2010

OTHER PUBLICATIONS

European Search Report for EP Patent Application 22165655.6, dated Sep. 22, 2022, 10 pages.
(Continued)

*Primary Examiner* — Jared Fureman
*Assistant Examiner* — Christopher J Clark
(74) *Attorney, Agent, or Firm* — Jordan IP Law, LLC

(57) ABSTRACT

Systems, apparatuses and methods may provide for technology that includes a solid state drive (SSD) having an enclosure, a non-volatile memory (NVM) device, a device controller coupled the NVM device, a capacitor, a backup voltage line coupled to the capacitor, and a safety assembly. The safety assembly may include a timer circuit including an input node coupled to the backup voltage line, a reset node, and an output node, an indicator circuit coupled to the output node of the timer circuit, and a temperature comparator circuit coupled to the reset node of the timer circuit, wherein if a temperature of the enclosure exceeds a threshold while a backup voltage is present on the backup voltage line, the temperature comparator circuit causes the timer circuit to trigger light pulses from the indicator circuit.

19 Claims, 6 Drawing Sheets

(51) Int. Cl.
H05B 45/3725 (2020.01)
H05B 45/395 (2020.01)

(56) References Cited

U.S. PATENT DOCUMENTS

2020/0409442 A1* 12/2020 Uryu ................ H02J 7/0068
2022/0326862 A1* 10/2022 Chen ................ G06F 3/0659

OTHER PUBLICATIONS

Intel Corporation, "Power Loss Imminent (PLI) Technology", 2014, 8 pages.

* cited by examiner

HOT AND HAZARDOUS INDICATOR ON SOLID STATE DRIVES

TECHNICAL FIELD

Embodiments generally relate to memory structures. More particularly, embodiments relate to a hot and hazardous indicator on solid state drives.

BACKGROUND

A typical solid state drive (SSD) has an enclosure that serves as a heatsink to dissipate heat generated by printed circuit board (PCB) components within the enclosure. The SSD may be designed to reduce the likelihood that the external surface temperature (e.g., "touch temperature") of the enclosure will exceed a temperature that is unsafe to the human body. The SSD enclosure touch temperature may be monitored by firmware (FW) based on input data from hardware components such as a temperature sensor on the PCB, memory media and a memory controller. In such a case, the firmware reports the enclosure touch temperature to a log that is accessible by the end user (e.g., technician during replacement or debugging) using toolbox software. While the toolbox software solution may be suitable under certain circumstances, there remains considerable room for improvement.

For example, if the temperature reporting firmware or hardware malfunctions (e.g., due to power rail shorts, incorrect calibration), the toolbox software may retrieve incomplete, inaccurate and/or unreliable temperature readings. Moreover, if a hot or hazardous SSD is installed in an array of SSDs, the technician may incorrectly check the temperature of the wrong SSD and assume that the hot or hazardous SSD is safe to touch. Additionally, once a hot and hazardous SSD is powered down, the toolbox software may be unusable.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
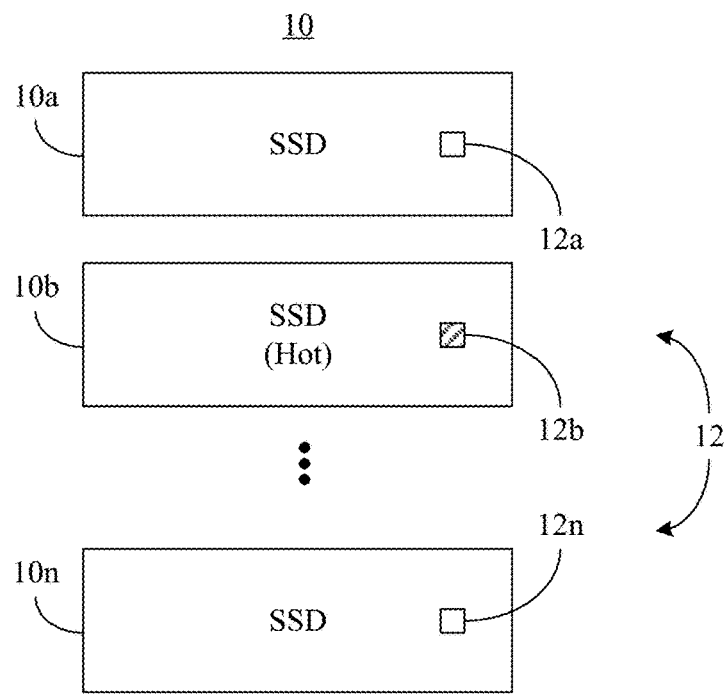
FIG. 1 is a block diagram of an example of a plurality of SSDs having hot and hazardous indicators according to an embodiment.

Turning now to FIG. 1, a plurality of SSDs 10 (10a-10n, e.g., in a storage server) is shown in which first SSD 10a has a safe touch temperature, a second SSD 10b has an unsafe touch temperature (e.g., has an enclosure temperature that exceeds a threshold such as 70° C. and is therefore considered "hot"), and an $n^{th}$ SSD 10n that has a safe touch temperature. In an embodiment, the SSDs 10 include indicators 12 (12a-12n) of whether the respective touch temperatures of the SSDs 10 are safe. For example, a first indicator 12a is not activated to signify that the first SSD 10a has a safe touch temperature, a second indicator 12b is activated (e.g., flashed, blinked) to signify that the second SSD 10b has an unsafe touch temperature, and an $n^{th}$ indicator 12n is not activated to signify that the $n^{th}$ SSD 10n has a safe temperature. The indicators 12 may be visual notification devices (e.g., light emitting diodes/LEDs). In one example, the second indicator 12b is an LED that is flashed (e.g., to emit light pulses) at a certain duty cycle (e.g., 10%) and frequency (e.g., 3 Hz) when the enclosure temperature is unsafe.

The illustrated SSDs 10 are safety-enhanced for several reasons. For example, the indicators 12 may obviate any need for toolbox software, which may retrieve incomplete, inaccurate and/or unreliable temperature readings if temperature reporting firmware or hardware within the SSDs 10 malfunctions (e.g., due to power rail shorts, incorrect calibration). Moreover, the indicators 12 reduce the likelihood that a technician may incorrectly check the temperature of the first SSD 10a or the $n^{th}$ SSD 10n and assume that the second SSD 10b is safe to touch. Additionally, the indicators 12 may be operable even after the SSDs 10 are powered down, which is a significant advantage over toolbox software.

Figure 2:
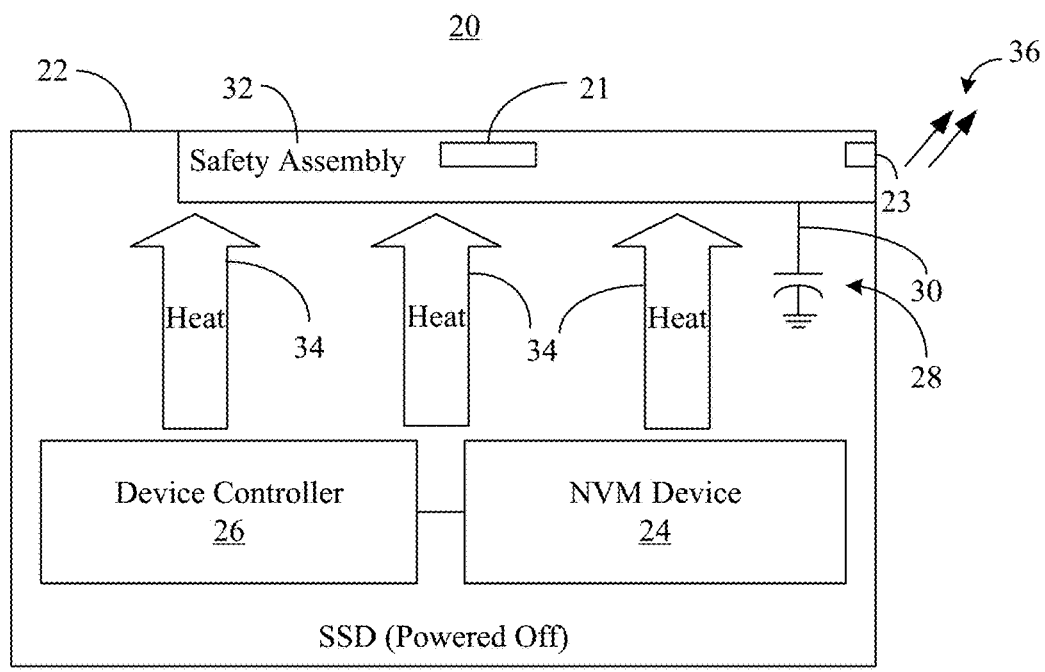
FIG. 2 is a block diagram of an example of an SSD according to an embodiment.

FIG. 2 shows an SSD 20 that includes an enclosure 22, a non-volatile memory (NVM) device 24, a device controller 26 coupled to the NVM device 24, a capacitor 28, a backup voltage line 30 coupled to the capacitor 28, and a safety assembly 32. In the illustrated example, heat 34 generated by the device controller 26 and/or NVM device 24 may reach the enclosure 22. The safety assembly 32 may include a temperature comparator 21 (e.g., thermistor) positioned in a location to detect the heat 34 and an indicator 23 positioned in a location that is visible to end users when the SSD 20 is installed. In an embodiment, if the heat 34 causes the temperature of the enclosure 22 to exceed a threshold (e.g., 70° C. so that the outer surface becomes unsafe to touch), the safety assembly 32 outputs light pulses 36 to alert nearby individuals (e.g., technicians) of the unsafe condition. As will be discussed in greater detail, the capacitor 28 may be charged to a backup voltage (e.g., power loss imminent/PLI voltage) during operation of the SSD 20. Accordingly, the backup voltage may be used to power the safety assembly 32 when the SSD 20 is powered off (e.g., when traditional toolbox software is unusable to detect the hot and hazardous condition).

Thus, the SSD 20 is safety-enhanced at least to the extent that the safety assembly 32 obviates any need for toolbox software, which may retrieve incomplete, inaccurate and/or unreliable temperature readings if temperature reporting firmware or hardware within the SSD 20 malfunctions. Moreover, the safety assembly 32 reduces the likelihood that a technician may incorrectly check the temperature of the wrong SSD (not shown) and assume that the SSD 20 is safe to touch. Additionally, the safety assembly 32 may be operable even after the SSD 20 is powered down, unlike toolbox software.

The SSD 20 may be part of a memory device that includes non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) Xpoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D Xpoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

Figure 3A:
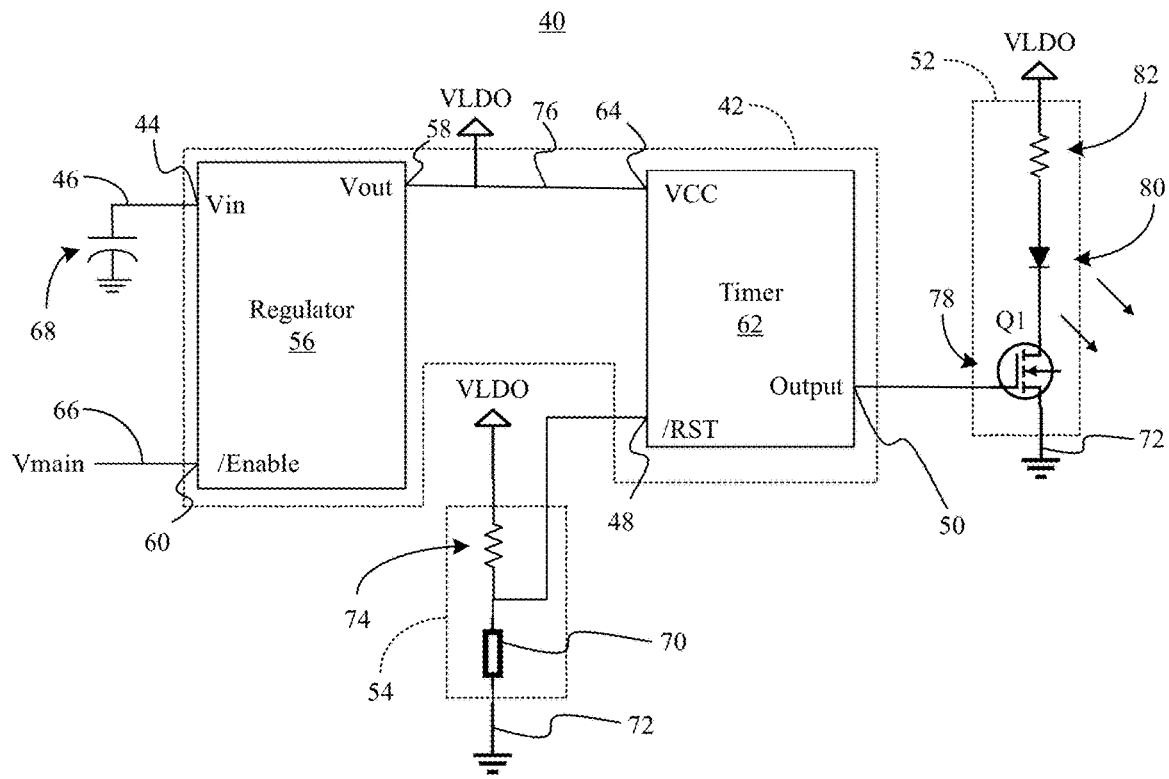
FIGS. 3A and 3B are schematic diagrams of examples of safety assemblies according to embodiments.

Turning now to FIG. 3A, a safety assembly 40 is shown in which a timer circuit 42 includes an input node 44 (e.g., contact, pin, trace, connection) coupled to a backup voltage line 46, a reset node 48, and an output node 50. The safety assembly 40 may also include an indicator circuit 52 coupled to the output node 50 of the timer circuit 42. In an embodiment, a temperature comparator circuit 54 is coupled to the reset node 48 of the timer circuit 42, wherein if an enclosure temperature (e.g., surface temperature of an SSD enclosure) exceeds a threshold while a backup voltage (e.g., PLI voltage) is present on the backup voltage line 46, the temperature comparator circuit 54 causes the timer circuit 42 to trigger light pulses from the indicator circuit 52.

In one example, the timer circuit 42 includes a regulator 56 (e.g., low dropout/LDO or buck-boost regulator) including the input node 44, a regulator output node 58, and an enablement node 60. Additionally, the timer circuit 42 may include a timer device 62 (e.g., 555 timer integrated circuit/ IC) having the output node 50, the reset node 48, and a timer input node 64 coupled to the regulator output node 58. The regulator 56 may convert the backup voltage (e.g., 35V) down to an operating voltage voltage (e.g., $V_{cc}$ of 3.3V) that is provided to the timer device 62 via a step-down voltage line 76. In an embodiment, the enablement node 60 is coupled to a main voltage line 66. Thus, a lack of a main voltage ($V_{main}$) on the main voltage line 66 (e.g., system power is off) enables the timer circuit 42 and the light pulses. By contrast, a presence of the main voltage on the main voltage line 66 disables the timer circuit 42 and the light pulses. Accordingly, the illustrated safety assembly 40 operates only when system power is off and while the backup voltage is present on the backup voltage line 46. As will be discussed in greater detail, the backup voltage may be provided by a capacitor 68 (e.g., aluminum electrolytic capacitor), which will discharge during operation of the safety assembly 40. Proper selection of the operating parameters of the timer device 62 may ensure that the light pulses are generated long enough for the enclosure temperature to fall below the safety threshold.

The illustrated temperature comparator circuit 54 includes a temperature comparator device 70 (e.g., thermistor positioned adjacent to the enclosure and/or heat-generating components) coupled to a ground connection 72 (e.g., contact, pin, trace, node) and the reset node 48. Additionally, the temperature comparator circuit 54 may include a divider resistor 74 coupled to the reset node 48 and the step-down voltage line 76 ($V_{LDO}$) of the timer circuit 42. In an embodiment, the indicator circuit 52 includes a switch 78 (e.g., metal oxide semiconductor field effect transistor/ MOSFET) coupled to the output node 50 and the ground connection 72. In one example, an LED 80 is coupled to the switch 78 and a series resistor 82 is coupled to the LED 80 and the step-down voltage line 76 of the timer circuit 76. The LED 80 may be mounted in a position that is visible through the enclosure while the SSD is installed in a system such as, for example, a data storage server. Indeed, the LED 80 may be a standard component in EDSFF (Enterprise and Data Center SSD Form Factor) SSDs.

During operation, when enclosure temperature exceeds the threshold, the temperature comparator device 70 will transition to a high resistance or open state and activate the timer device 62 by pulling the reset node 48 high. Activating the timer device 62 causes the output node 50 to periodically activate the LED 80 via the switch 78. As already noted, the indicator circuit 52 may be modified to include a speaker/ buzzer instead of, or in addition to, the LED 80 to provide audible/sound notifications.

Figure 3B:
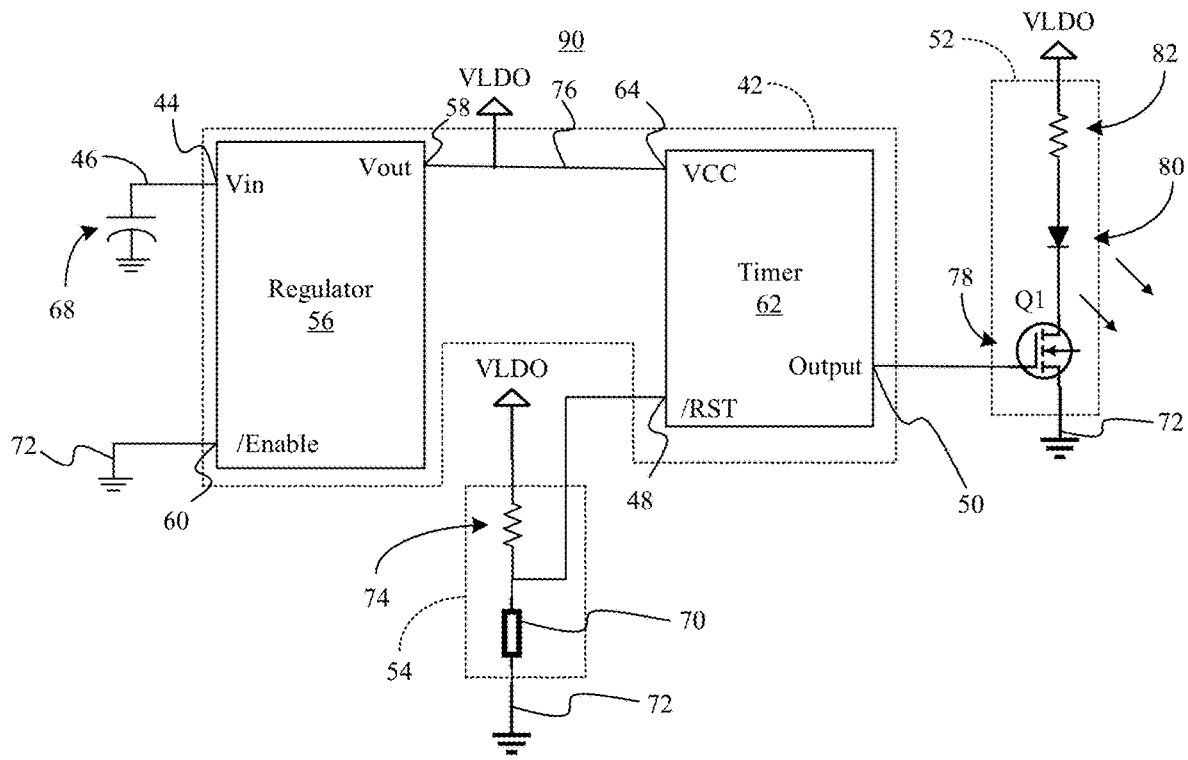

FIG. 3B shows a safety assembly 90 that is the same as the safety assembly 40 (FIG. 3A) except that the enablement node 60 is coupled to the ground connection 72. Accordingly, the ground connection 72 enables the timer circuit 42 and the light pulses while when the system power is both powered off and powered on. In the illustrated solution, the LED 80 may be an additional LED that is dedicated to the safety assembly 90 (e.g., not shared with other components of the SSD).

Figure 4:
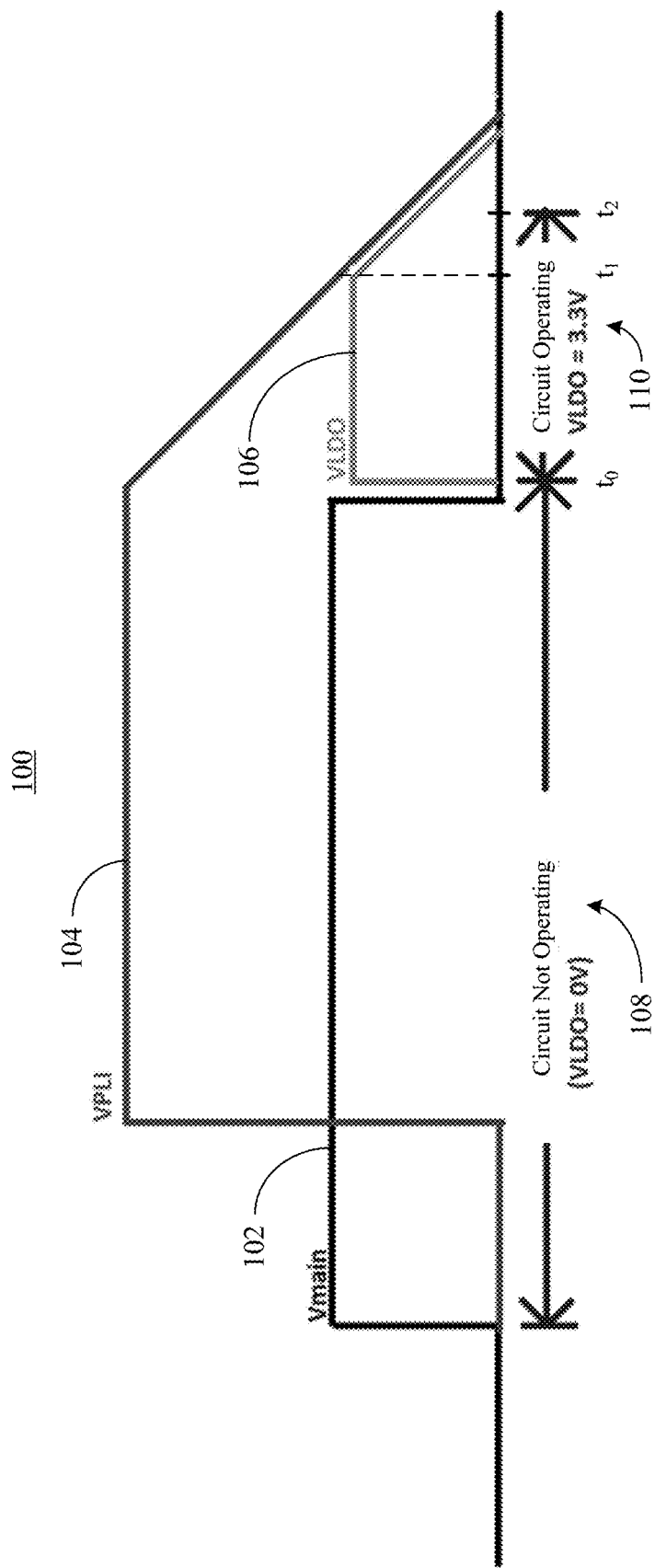
FIG. 4 is a plot of an example of an operating region of a safety assembly according to an embodiment.

FIG. 4 shows a plot 100 of a main voltage ($V_{main}$) curve 102, a backup voltage ($V_{PLI}$) curve 104, and a step-down voltage curve 106 ($V_{LDO}$). In the illustrated example, the safety assembly is not operating during a period 108 when the main voltage is present. At time $t_0$, the main voltage is turned off, the step-down voltage goes high, the backup voltage begins to drop (e.g., due to discharge of the PLI capacitor), and a period 110 begins. At time $t_1$, the backup voltage reaches the step-down voltage and the step-down voltage begins to drop along with the backup voltage. At time $t_2$, the safety assembly ceases operation. In an embodiment, operating parameters such as the duty cycle and frequency of the LED are selected so that the period 110 is long enough for the enclosure to cool down to a safe temperature.

Figure 5:
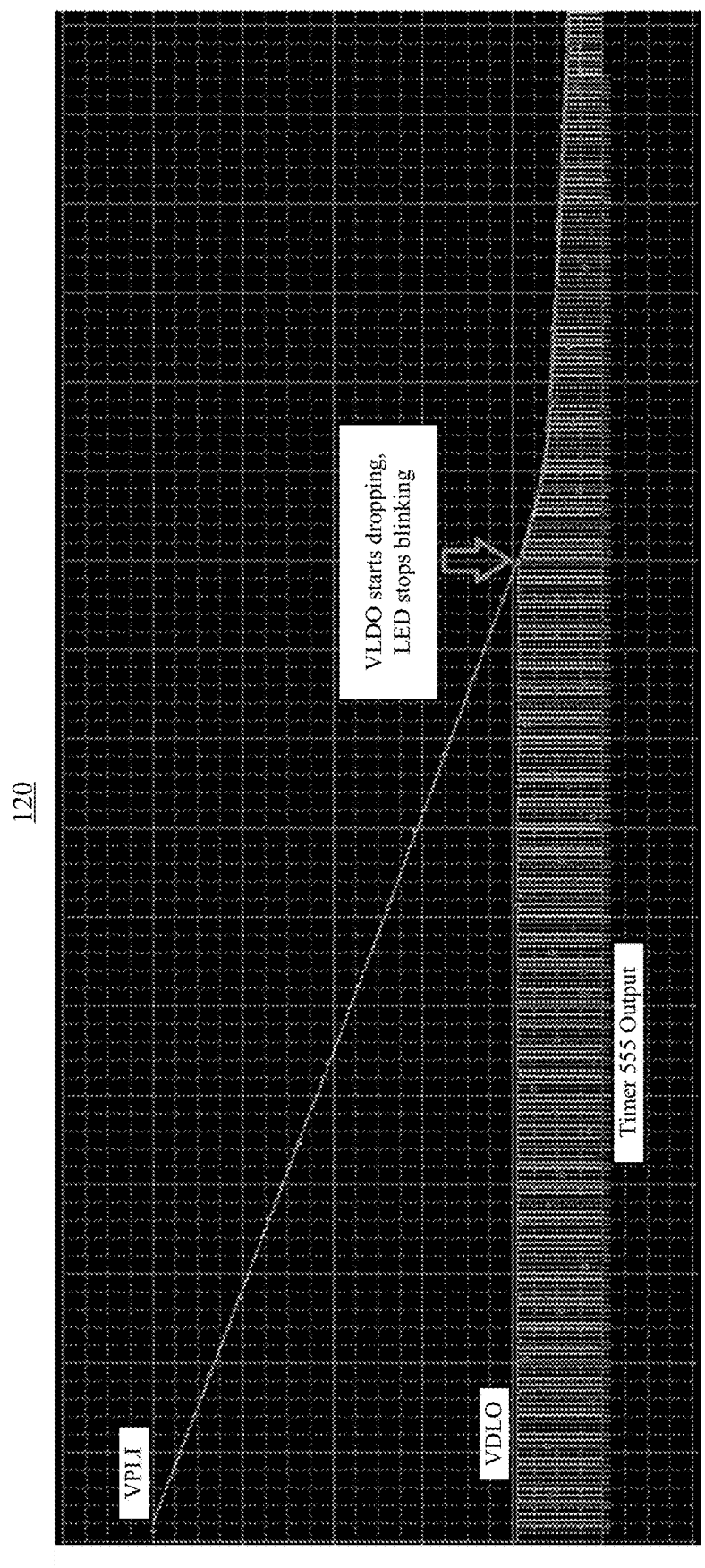
FIG. 5 is a plot of an example of a timer output according to an embodiment.

For example, FIG. 5 demonstrates in a plot 120 that with a 2000 uF aluminum electrolytic capacitor charged to 20V, a 10% duty cycle and a blinking frequency of 3 Hz, the safety assembly 40 (FIG. 3A) can operate for up to 55 seconds. A capacitor voltage value of 20V is chosen as empirical data shows that firmware can complete a PLI data dump before the PLI voltage drops below 20V from a full charge of 35V. A duty cycle value of 10% may minimize the energy needed to blink/flash the LED. Additionally, an SSD having an E1.L form factor may have 100 seconds to cool down from 70° C. to 50° C. The operating duration of the safety assembly may be further extended using techniques such as increasing the PLI capacitor capacitance, increasing the PLI voltage, using a buck-boost regulator, which will generate output voltages at lower input voltages and with better efficiency, and so forth.

Figure 6A:
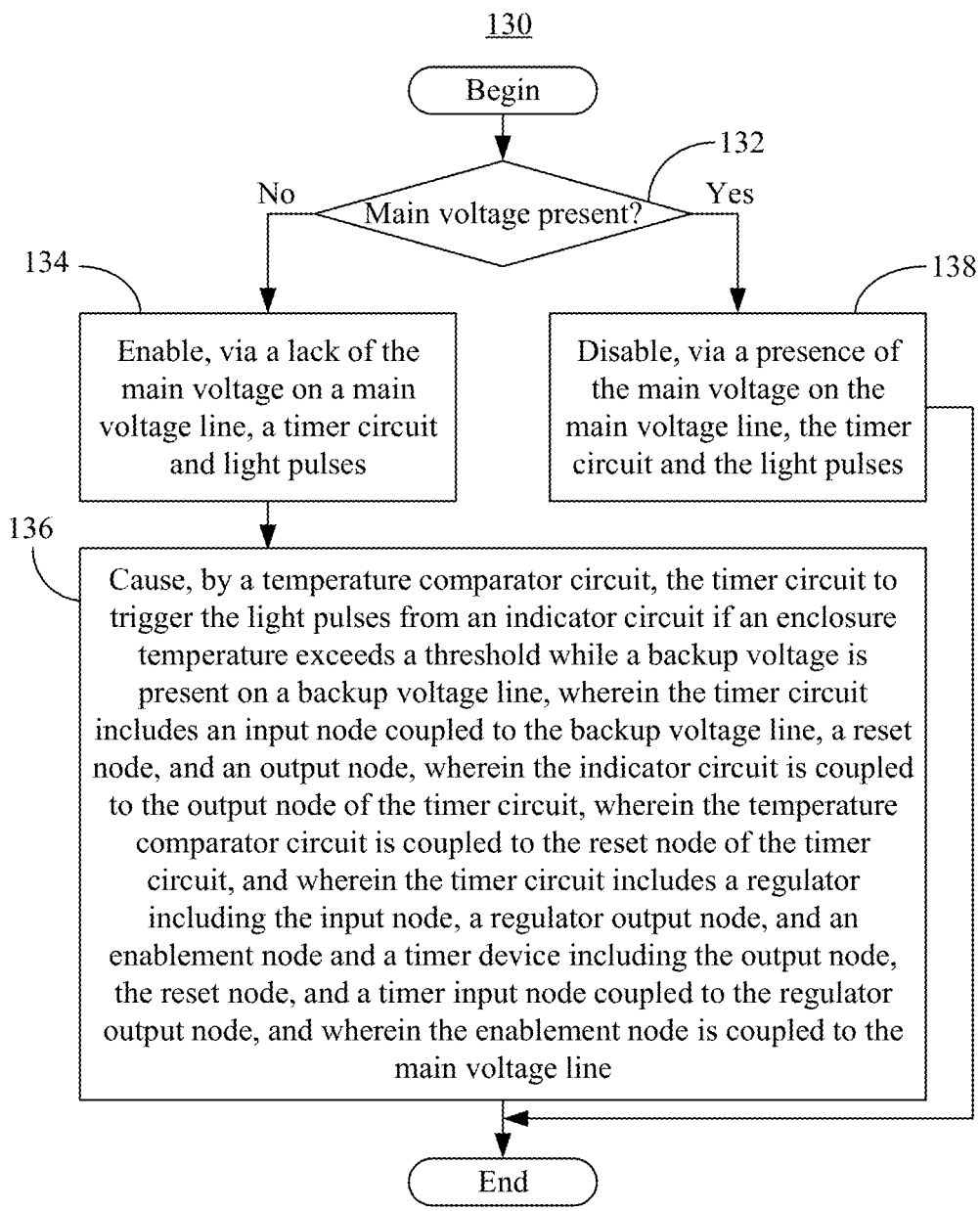
FIGS. 6A and 6B are flowcharts of examples of methods of operating a safety assembly according to an embodiment.

FIG. 6A shows a method 130 of operating a performance-enhanced safety assembly. The method 130 may generally be implemented in a safety assembly such as, for example, the safety assembly 40 (FIG. 3A), already discussed. More particularly, the method 130 may be implemented in configurable logic such as, for example, programmable logic arrays (PLAs), field-programmable gate arrays (FPGAs), complex programmable logic devices (CPLDs), in fixed-functionality hardware logic using circuit technology such as, for example, application-specific integrated circuit (ASIC), complementary metal oxide semiconductor (CMOS) or transistor-transistor logic (TTL) technology, or any combination thereof.

Illustrated processing block 132 determines whether a main voltage is present on a main voltage line. If not, block 134 enables, via a lack of the main voltage on the main voltage line, a timer circuit and light pulses. In an embodiment, block 136 causes, by a temperature comparator circuit, the timer circuit to trigger the light pulses from an indicator circuit if an enclosure temperature exceeds a threshold while a backup voltage is present on a backup voltage line. In the illustrated example, the timer circuit includes an input node coupled to the backup voltage line, a reset node (e.g., input of the timer circuit), and an output node. Additionally, the indicator circuit may be coupled to the output node of the timer circuit and the temperature comparator circuit may be coupled to the reset node of the timer circuit. In one example, the timer circuit includes a regulator including the input node, a regulator output node, and an enablement node and a timer device including the output node, the reset node, and a timer input node coupled to the regulator output node. In an embodiment, the enablement node is coupled to the main voltage line. If it is determined at block 132 that the main voltage is present on the main voltage line, block 138 disables, via the presence of the main voltage on the main voltage line, the timer circuit and the light pulses.

The method 130 therefore enhances performance and safety at least to the extent that the safety assembly obviates any need for toolbox software, which may retrieve incomplete, inaccurate and/or unreliable temperature readings if temperature reporting firmware or hardware within the SSD malfunctions. Moreover, the method 130 reduces the likelihood that a technician may incorrectly check the temperature of the wrong SSD and assume that the hot and hazardous SSD is safe to touch. Additionally, the method 130 is operable even after the SSD is powered off, unlike toolbox software.

Figure 6B:
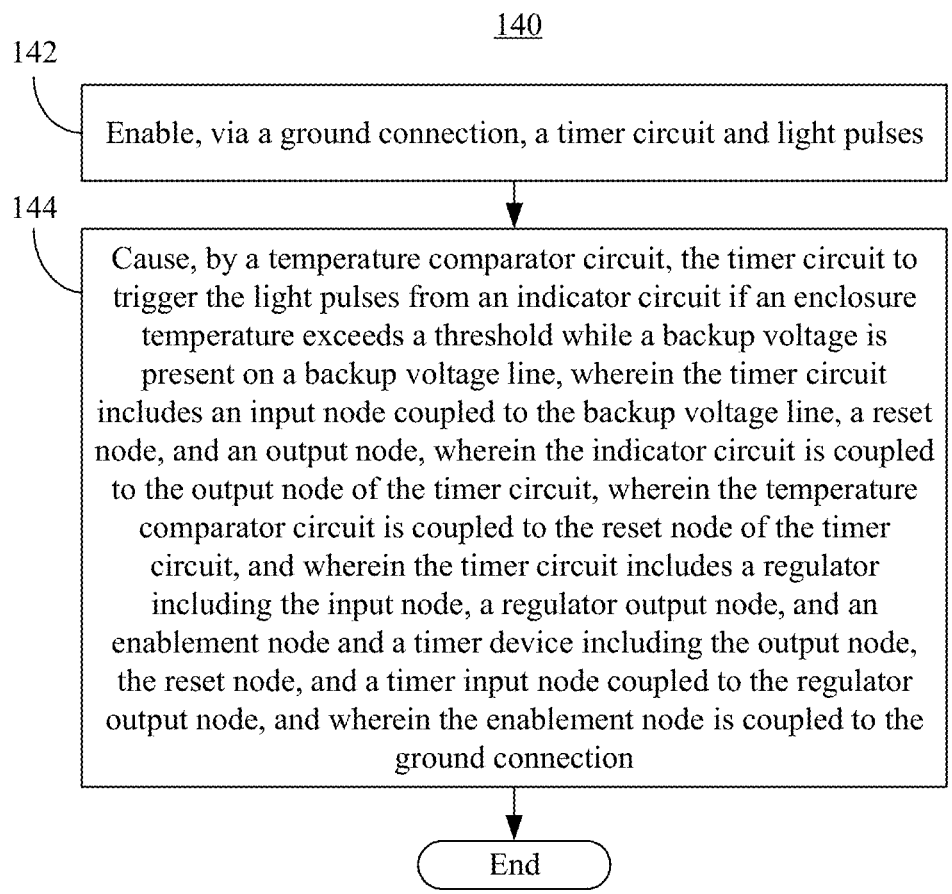

FIG. 6B shows another method 140 of operating a performance-enhanced safety assembly. The method 140 may generally be implemented in a safety assembly such as, for example, safety assembly 90 (FIG. 3B), already discussed. More particularly, the method 140 may be implemented in configurable logic such as, for example, PLAs, FPGAs, CPLDs, in fixed-functionality hardware logic using circuit technology such as, for example, ASIC, CMOS or TTL technology, or any combination thereof.

Illustrated processing block 142 enables, via a ground connection, a timer circuit and light pulses. In an embodiment, block 144 causes, by a temperature comparator circuit, the timer circuit to trigger the light pulses from an indicator circuit if an enclosure temperature exceeds a threshold while a backup voltage is present on a backup voltage line. In the illustrated example, the timer circuit includes an input node coupled to the backup voltage line, a reset node (e.g., input of the timer circuit), and an output node. Additionally, the indicator circuit may be coupled to the output node of the timer circuit and the temperature comparator circuit may be coupled to the reset node of the timer circuit. In one example, the timer circuit includes a regulator including the input node, a regulator output node, and an enablement node and a timer device including the output node, the reset node, and a timer input node coupled to the regulator output node. In an embodiment, the enablement node is coupled to the ground connection.

The method 140 therefore enhances performance and safety at least to the extent that the safety assembly obviates any need for toolbox software, which may retrieve incomplete, inaccurate and/or unreliable temperature readings if temperature reporting firmware or hardware within the SSD malfunctions. Moreover, the method 140 reduces the likelihood that a technician may incorrectly check the temperature of the wrong SSD and assume that the hot and hazardous SSD is safe to touch. Additionally, the method 130 is operable when the SSD is both powered on and powered off, unlike toolbox software.

Additional Notes and Examples

Example 1 includes a performance-enhanced solid state drive (SSD) comprising an enclosure, a non-volatile memory (NVM) device, a device controller coupled the NVM device, a capacitor, a backup voltage line coupled to the capacitor, and a safety assembly comprising a timer circuit including an input node coupled to the backup voltage line, a reset node, and an output node, an indicator circuit coupled to the output node of the timer circuit, and a temperature comparator circuit coupled to the reset node of the timer circuit, wherein if a temperature of the enclosure exceeds a threshold while a backup voltage is present on the backup voltage line, the temperature comparator circuit causes the timer circuit to trigger light pulses from the indicator circuit.

Example 2 includes the SSD of Example 1, wherein the timer circuit includes a regulator including the input node, a regulator output node, and an enablement node, and a timer device including the output node, the reset node, and a timer input node coupled to the regulator output node.

Example 3 includes the SSD of Example 2, wherein the enablement node is coupled to a main voltage line, wherein a lack of a main voltage on the main voltage line enables the timer circuit and the light pulses while the SSD is powered off, and wherein a presence of main voltage on the main voltage line disables the light pulses and the light pulses while the SSD is powered on.

Example 4 includes the SSD of Example 2, wherein the enablement node is coupled to a ground connection, and wherein the ground connection enables the timer circuit and the light pulses while the SSD is powered on and powered off.

Example 5 includes the SSD of Example 2, wherein the regular includes a low dropout regulator.

Example 6 includes the SSD of Example 2, wherein the regular includes a buck-boost regulator.

Example 7 includes the SSD of Example 1, wherein the temperature comparator circuit includes a temperature comparator device coupled to a ground connection and the reset node, and a divider resistor coupled to the reset node and a step-down voltage line of the timer circuit.

Example 8 includes the SSD of any one of Examples 1 to 7, wherein the indicator circuit includes a switch coupled to the output node and a ground connection, a light emitting diode (LED) coupled to the switch, and a series resistor coupled to the LED and a step-down voltage line of the timer circuit.

Example 9 includes a performance-enhanced safety assembly comprising a timer circuit including an input node coupled to a backup voltage line, a reset node, and an output node, an indicator circuit coupled to the output node of the timer circuit, and a temperature comparator circuit coupled to the reset node of the timer circuit, wherein if an enclosure temperature exceeds a threshold while a backup voltage is present on the backup voltage line, the temperature comparator circuit causes the timer circuit to trigger light pulses from the indicator circuit.

Example 10 includes the safety assembly of Example 9, wherein the timer circuit includes a regulator including the input node, a regulator output node, and an enablement node, and a timer device including the output node, the reset node, and a timer input node coupled to the regulator output node.

Example 11 includes the safety assembly of Example 10, wherein the enablement node is coupled to a main voltage line, wherein a lack of a main voltage on the main voltage line enables the timer circuit and the light pulses, and wherein a presence of main voltage on the main voltage line disables the timer circuit and the light pulses.

Example 12 includes the safety assembly of Example 10, wherein the enablement node is coupled to a ground connection, and wherein the ground connection enables the timer circuit and the light pulses.

Example 13 includes the safety assembly of Example 10, wherein the regular includes a low dropout regulator.

Example 14 includes the safety assembly of Example 10, wherein the regular includes a buck-boost regulator.

Example 15 includes the safety assembly of Example 9, wherein the temperature comparator circuit includes a temperature comparator device coupled to a ground connection and the reset node, and a divider resistor coupled to the reset node and a step-down voltage line of the timer circuit.

Example 16 includes the safety assembly of any one of Examples 9 to 15, wherein the indicator circuit includes a switch coupled to the output node and a ground connection, a light emitting diode (LED) coupled to the switch, and a series resistor coupled to the LED and a step-down voltage line of the timer circuit.

Example 17 includes a method of operating a safety assembly, the method comprising causing, by a temperature comparator circuit, a timer circuit to trigger light pulses from an indicator circuit if an enclosure temperature exceeds a threshold while a backup voltage is present on a backup voltage line, wherein the timer circuit includes an input node coupled to the backup voltage line, a reset node, and an output node, wherein the indicator circuit is coupled to the output node of the timer circuit, and wherein the temperature comparator circuit is coupled to the reset node of the timer circuit.

Example 18 includes the method of Example 17, wherein the timer circuit includes a regulator including the input node, a regulator output node, and an enablement node and a timer device including the output node, the reset node, and a timer input node coupled to the regulator output node, wherein the enablement node is coupled to a main voltage line, and wherein the method further includes enabling, via a lack of a main voltage on the main voltage line, the timer circuit and the light pulses, and disabling, via a presence of main voltage on the main voltage line, the timer circuit and the light pulses.

Example 19 includes the method of Example 17, wherein the timer circuit includes a regulator including the input node, a regulator output node, and an enablement node and a timer device including the output node, the reset node, and a timer input node coupled to the regulator output node, wherein the enablement node is coupled to a ground connection, and wherein the method further includes enabling, via the ground connection, the timer circuit and the light pulses.

Technology described herein therefore provides a visible indicator (e.g., located on the front of a drive to be user visible) of the drive running hot. The technology is firmware and software independent and it may operate even if firmware is not executing due to a severe failure. The technology also reduces the possibility of injuries due to human error reading the wrong SSD enclosure temperature from an SSD toolbox. Additionally, the technology provides an alternative to thermal throttling, which may reduce performance or require additional airflow or heat pipe components to maintain performance (e.g., leading to increased cost and a lack of competitiveness). Moreover, the technology enhances safety over regulatory warning labels that are not visible to the user when the SSD is assembled in the system.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A solid state drive (SSD) comprising:
an enclosure;
a non-volatile memory (NVM) device;
a device controller coupled to the NVM device;
a capacitor;
a backup voltage line coupled to the capacitor; and
a safety assembly comprising:
  a timer circuit including an input node coupled to the backup voltage line, a reset node, and an output node,
  an indicator circuit coupled to the output node of the timer circuit, and
  a temperature comparator circuit coupled to the reset node of the timer circuit, wherein if a temperature of the enclosure exceeds a threshold while a backup voltage is present on the backup voltage line, the temperature comparator circuit causes the timer circuit to trigger light pulses from the indicator circuit.

2. The SSD of claim 1, wherein the timer circuit includes:
a regulator including the input node, a regulator output node, and an enablement node, and
a timer device including the output node, the reset node, and a timer input node coupled to the regulator output node.

3. The SSD of claim 2, wherein the enablement node is coupled to a main voltage line, wherein a lack of a main voltage on the main voltage line enables the timer circuit and the light pulses while the SSD is powered off, and wherein a presence of main voltage on the main voltage line disables the light pulses and the light pulses while the SSD is powered on.

4. The SSD of claim 2, wherein the enablement node is coupled to a ground connection, and wherein the ground connection enables the timer circuit and the light pulses while the SSD is powered on and powered off.

5. The SSD of claim 2, wherein the regular includes a low dropout regulator.

6. The SSD of claim 2, wherein the regular includes a buck-boost regulator.

7. The SSD of claim 1, wherein the temperature comparator circuit includes:
a temperature comparator device coupled to a ground connection and the reset node, and
a divider resistor coupled to the reset node and a step-down voltage line of the timer circuit.

8. The SSD of claim 1, wherein the indicator circuit includes:
a switch coupled to the output node and a ground connection,
a light emitting diode (LED) coupled to the switch, and
a series resistor coupled to the LED and a step-down voltage line of the timer circuit.

9. A safety assembly comprising:
a timer circuit including an input node coupled to a backup voltage line, a reset node, and an output node;
an indicator circuit coupled to the output node of the timer circuit; and
a temperature comparator circuit coupled to the reset node of the timer circuit, wherein if an enclosure temperature exceeds a threshold while a backup voltage is present on the backup voltage line, the temperature comparator circuit causes the timer circuit to trigger light pulses from the indicator circuit.

10. The safety assembly of claim 9, wherein the timer circuit includes:
a regulator including the input node, a regulator output node, and an enablement node; and
a timer device including the output node, the reset node, and a timer input node coupled to the regulator output node.

11. The safety assembly of claim 10, wherein the enablement node is coupled to a main voltage line, wherein a lack of a main voltage on the main voltage line enables the timer circuit and the light pulses, and wherein a presence of main voltage on the main voltage line disables the timer circuit and the light pulses.

12. The safety assembly of claim 10, wherein the enablement node is coupled to a ground connection, and wherein the ground connection enables the timer circuit and the light pulses.

13. The safety assembly of claim 10, wherein the regular includes a low dropout regulator.

14. The safety assembly of claim 10, wherein the regular includes a buck-boost regulator.

15. The safety assembly of claim 9, wherein the temperature comparator circuit includes:
a temperature comparator device coupled to a ground connection and the reset node; and
a divider resistor coupled to the reset node and a step-down voltage line of the timer circuit.

16. The safety assembly of claim 9, wherein the indicator circuit includes:
a switch coupled to the output node and a ground connection;
a light emitting diode (LED) coupled to the switch; and a series resistor coupled to the LED and a step-down voltage line of the timer circuit.

17. A method of operating a safety assembly, the method comprising:
causing, by a temperature comparator circuit, a timer circuit to trigger light pulses from an indicator circuit if an enclosure temperature exceeds a threshold while a backup voltage is present on a backup voltage line, wherein the timer circuit includes an input node coupled to the backup voltage line, a reset node, and an output node, wherein the indicator circuit is coupled to the output node of the timer circuit, and wherein the temperature comparator circuit is coupled to the reset node of the timer circuit.

18. The method of claim 17, wherein the timer circuit includes a regulator including the input node, a regulator output node, and an enablement node and a timer device including the output node, the reset node, and a timer input node coupled to the regulator output node, wherein the enablement node is coupled to a main voltage line, and wherein the method further includes:
enabling, via a lack of a main voltage on the main voltage line, the timer circuit and the light pulses; and
disabling, via a presence of main voltage on the main voltage line, the timer circuit and the light pulses.

19. The method of claim 17, wherein the timer circuit includes a regulator including the input node, a regulator output node, and an enablement node and a timer device including the output node, the reset node, and a timer input node coupled to the regulator output node, wherein the enablement node is coupled to a ground connection, and wherein the method further includes enabling, via the ground connection, the timer circuit and the light pulses.

* * * * *